US010600887B2

United States Patent
Yamashita et al.

(10) Patent No.: US 10,600,887 B2
(45) Date of Patent: Mar. 24, 2020

(54) APPROACH TO HIGH-K DIELECTRIC FEATURE UNIFORMITY (71) Applicant: INTERNATIONAL BUSINESS MACHINES CORPORATION, Armonk, NY (US)

(72) Inventors: Tenko Yamashita, Schenectady, NY (US); Chun Wing Yeung, Niskayuna, NY (US); Chen Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/180,723

(22) Filed: Nov. 5, 2018

(65) Prior Publication Data

US 2019/0131435 A1 May 2, 2019

Related U.S. Application Data (62) Division of application No. 15/797,721, filed on Oct. 30, 2017, now Pat. No. 10,170,588.

(51) Int. Cl.
*H01L 29/66* (2006.01)
*H01L 29/78* (2006.01)
(Continued)

(52) U.S. Cl.
CPC .. *H01L 29/66666* (2013.01); *H01L 21/02167* (2013.01); *H01L 29/1054* (2013.01);
(Continued)

(58) Field of Classification Search
CPC ......... H01L 29/66272; H01L 29/66666; H01L 29/7802; H01L 29/7827; H01L 29/78642
See application file for complete search history.

(56) References Cited

U.S. PATENT DOCUMENTS 6,770,534 B2  8/2004  Cho et al.
7,683,428 B2  3/2010  Chidambarrao et al.
(Continued)

FOREIGN PATENT DOCUMENTS

CN  104835846 A  8/2015
WO  2017052601 A1  3/2017

OTHER PUBLICATIONS

International Search Report and Written Opinion in corresponding International Patent Application No. PCT/IB2018/058250 dated Feb. 20, 2019, 9 pages.
(Continued)

*Primary Examiner* — Hoai V Pham
(74) *Attorney, Agent, or Firm* — Tutunjian & Bitetto, P.C.; Vazken Alexanian (57) ABSTRACT

A method of forming a vertical transport fin field effect transistor is provided. The method includes forming a doped layer on a substrate, and forming a multilayer fin on the doped layer, where the multilayer fin includes a lower trim layer portion, an upper trim layer portion, and a fin channel portion between the upper and lower trim layer portions. A portion of the lower trim layer portion is removed to form a lower trim layer post, and a portion of the upper trim layer portion is removed to form an upper trim layer post. An upper recess filler is formed adjacent to the upper trim layer post, and a lower recess filler is formed adjacent to the lower trim layer post. A portion of the fin channel portion is removed to form a fin channel post between the upper trim layer post and lower trim layer post.

20 Claims, 10 Drawing Sheets (51) Int. Cl.
*H01L 29/10* (2006.01)
*H01L 21/02* (2006.01)
*H01L 29/51* (2006.01)
*H01L 29/165* (2006.01)

(52) U.S. Cl.
CPC ........ *H01L 29/517* (2013.01); *H01L 29/7827* (2013.01); *H01L 21/0228* (2013.01); *H01L 21/02274* (2013.01); *H01L 29/165* (2013.01)

(56) References Cited

U.S. PATENT DOCUMENTS

| | | | |
|---|---|---|---|
| 9,397,226 | B2 | 7/2016 | Basu et al. |
| 9,530,700 | B1 | 12/2016 | Mallela et al. |
| 9,564,440 | B2 | 2/2017 | Cho et al. |
| 9,614,087 | B1 | 4/2017 | Cheng et al. |
| 9,627,511 | B1 | 4/2017 | Cheng et al. |
| 9,647,120 | B1 | 5/2017 | Bi et al. |
| 9,704,990 | B1 | 7/2017 | Mochizuki et al. |
| 9,780,208 | B1 | 10/2017 | Xie et al. |
| 2006/0261406 | A1 | 11/2006 | Chen |
| 2017/0084741 | A1* | 3/2017 | Lin .................... H01L 29/7842 |
| 2017/0288056 | A1 | 10/2017 | Balakrishnan et al. |
| 2018/0269312 | A1* | 9/2018 | Xie .................... H01L 29/66666 |
| 2018/0350951 | A1* | 12/2018 | Yamashita ........ H01L 29/66666 |

OTHER PUBLICATIONS

List of IBM Patents or Patent Applications Treated as Related dated Nov. 5, 2018, 2 pages.

Yamashita et al., "Improved Vertical FET Process with Controlled Gate Length and Self-aligned Junctions," U.S. Appl. No. 15/611,981, filed Jun. 2, 2017. pp. 1-33.

* cited by examiner

APPROACH TO HIGH-K DIELECTRIC FEATURE UNIFORMITY

BACKGROUND

Technical Field

The present invention generally relates to forming high-k dielectric device features having dimension uniformity with neighboring non-high-k device features, and more particularly to the formation of recessed high-k dielectric layers terminating at a predefined position to control feature uniformity.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS) device, where a p-channel MOSFET and n-channel MOSFET are coupled together.

With ever decreasing device dimensions, forming the individual components and electrical contacts becomes more difficult. An approach is therefore needed that retains the positive aspects of traditional FET structures, while overcoming the scaling issues created by forming smaller device components.

SUMMARY

In accordance with an embodiment of the present invention, a method of forming a vertical transport fin field effect transistor is provided. The method includes forming a doped layer on a substrate, and forming a multilayer fin on the doped layer, wherein the multilayer fin includes a lower trim layer portion, an upper trim layer portion, and a fin channel portion between the lower trim layer portion and the upper trim layer portion. The method further includes removing a portion of the lower trim layer portion to form a lower trim layer post, and removing a portion of the upper trim layer portion to form an upper trim layer post. The method further includes forming an upper recess filler adjacent to the upper trim layer post, and a lower recess filler adjacent to the lower trim layer post. The method further includes removing a portion of the fin channel portion to form a fin channel post between the upper trim layer post and lower trim layer post.

In accordance with another embodiment of the present invention, a method of forming a vertical transport fin field effect transistor is provided. The method includes forming a multilayer fin on a doped layer, wherein the multilayer fin includes a silicon-germanium (SiGe) lower trim layer portion, a silicon-germanium (SiGe) upper trim layer portion, and a silicon (Si) fin channel portion between the lower trim layer portion and upper trim layer portion. The method further includes removing a portion of the lower trim layer portion to form a lower trim layer post, and removing a portion of the upper trim layer portion to form an upper trim layer post. The method further includes forming an upper recess filler adjacent to the upper trim layer post, and a lower recess filler adjacent to the lower trim layer post. The method further includes removing a portion of the fin channel portion to form a fin channel post between the upper trim layer post and lower trim layer post.

In accordance with yet another embodiment of the present invention, a vertical transport fin field effect transistor is provided. The vertical transport fin field effect transistor (VT FinFET) includes a bottom source/drain region on a substrate. The VT FinFET further includes a lower trim layer post on the bottom source/drain region, a fin channel post on the lower trim layer post, and an upper trim layer post on the fin channel post. The VT FinFET further includes an upper recess filler on the sidewalls of the upper trim layer post, and a high-k channel liner on the fin channel post and a bottom surface of the upper recess filler.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate generally to controlling the length and positioning of the high-k dielectric layer forming a gate structure, so an upper end of the high-k dielectric layer does not extend beyond the layers forming the adjoining gate electrode. The high-k dielectric layer can have improved dimension uniformity with the neighboring non-high-k device features.

Embodiments of the present invention relate generally to compensating for differences in etching properties of the high-k dielectric layer forming a gate structure to avoid having the high-k dielectric layer under-etched relative to the layers forming the adjoining gate electrode.

Embodiments of the present invention also relate generally to the formation of recessed high-k dielectric layers terminating at a predefined position to control the dimensional uniformity of the gate structure determining the gate length. The formation of a recessed portion of a high-k dielectric layer on a thinned channel region can control the height and positioning of the terminal ends of the high-k dielectric layer. An overhanging fin template and upper recess filler can shield the recessed high-k dielectric layer, and provide a defined trimming surface for removing the high-k dielectric layer by self-aligned chamfering.

Embodiments of the present invention also relate generally to using a protective apron and overhanging fin template to shield a portion of a high-k dielectric layer forming a gate structure during etching.

Exemplary applications/uses to which the present invention can be applied include, but are not limited to: vertical transport fin field effect transistors (VT FinFETs) used in logic and memory devices.

It is to be understood that aspects of the present invention will be described in terms of a given illustrative architecture; however, other architectures, structures, substrate materials and process features and steps can be varied within the scope of aspects of the present invention.

Figure 1:
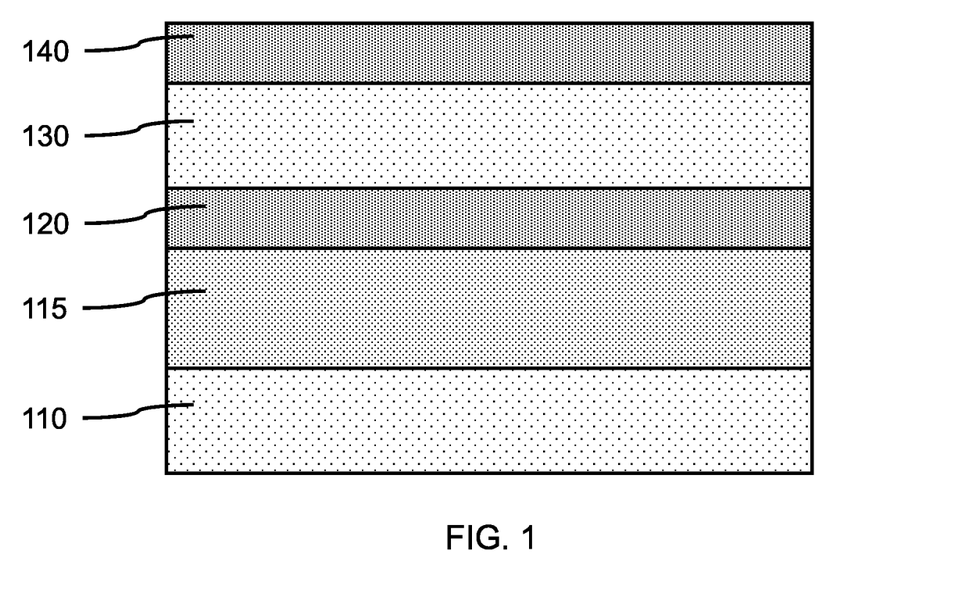
FIG. 1 is a cross-sectional side view showing a multilayer semiconductor stack on a substrate, in accordance with an embodiment of the present invention.

Referring now to the drawings in which like numerals represent the same or similar elements and initially to FIG. 1, a cross-sectional side view of a multilayer semiconductor stack on a substrate is shown, in accordance with an embodiment of the present invention.

A substrate 110 can be, for example, a single crystal semiconductor material wafer or a semiconductor-on-insulator stacked wafer. The substrate 110 can include a support layer that provides structural support, and an active semiconductor layer that can form devices. An insulating layer may be between the active semiconductor layer and the support layer to form a semiconductor-on-insulator substrate (SeOI) (e.g., a silicon-on-insulator substrate (SOI)). In various embodiments, the substrate 110 can be a single crystal silicon wafer.

The support layer can include crystalline, semi-crystalline, micro-crystalline, nano-crystalline, and/or amorphous phases. The support layer can be a semiconductor (e.g., silicon (Si), silicon carbide (SiC), silicon-germanium (SiGe), germanium (Ge), gallium-arsenide (GaAs), cadmium-telluride (CdTe), etc.), an insulator (e.g.: glass (e.g. silica, borosilicate glass), ceramic (e.g., aluminum oxide ($Al_2O_3$, sapphire), plastic (e.g., polycarbonate, polyacetonitrile), metal (e.g. aluminum, gold, titanium, molybdenum-copper (MoCu) composites, etc.), or combination thereof.

The active semiconductor layer can be a crystalline semiconductor, for example, a IV or IV-IV semiconductor (e.g., silicon (Si), silicon carbide (SiC), silicon-germanium (SiGe), germanium (Ge)), or a III-V semiconductor (e.g., gallium-arsenide (GaAs), indium-phosphide (InP), indium-antimonide (InSb)). In various embodiments, the semiconductor layer can be single crystal silicon.

The insulating layer can be, for example, a buried oxide (BOX) layer (e.g., $SiO_2$) or an implanted layer forming a buried insulating material.

In one or more embodiments, a doped layer 115 can be formed on a substrate 110, where the doped layer 115 can be suitably doped with n-type dopants and/or p-type dopants to form a source/drain for a fin field effect transistor device. The doped layer 115 can be formed by epitaxial growth on the substrate 110, or by implantation of a dopant into the substrate. The doped layer 115 can be a semiconductor material, for example, silicon (Si) or silicon-germanium (SiGe), where the doped layer 115 can be a single crystal material.

In various embodiments, the doped layer 115 can be n-doped or p-doped single crystal silicon (Si). The doped layer 115 can be a first layer of a multilayer semiconductor stack on the substrate 110. The doped layer 115 can be doped in situ (during formation of the layer), ex situ (after formation of the layer), or both, to achieve a predetermined dopant concentration.

In various embodiments, the doped layer 115 can have a thickness in the range of about 20 nm to about 50 nm, although other thicknesses are contemplated.

In one or more embodiments, a lower trim layer 120 of a multilayer fin stack can be formed on the doped layer 115, where the lower trim layer 120 can be formed by epitaxial growth. The lower trim layer 120 can be a single crystal semiconductor material. In various embodiments, the lower trim layer 120 can be silicon-germanium (SiGe), where the lower trim layer 120 can be single crystal SiGe.

In various embodiments, the lower trim layer 120 can have a thickness in the range of about 4 nm to about 10 nm, or in the range of about 5 nm to about 8 nm.

In one or more embodiments, a middle channel layer 130 of a multilayer fin stack can be formed on the lower trim layer 120, where the middle channel layer 130 can be formed by epitaxial growth on the lower trim layer 120. The middle channel layer 130 can be a single crystal semiconductor material. The middle channel layer 130 can be silicon (Si), where the middle channel layer 130 can be single crystal silicon.

In various embodiments, the middle channel layer 130 can have a thickness in the range of about 10 nm to about 40 nm, or in the range of about 15 nm to about 30 nm, or in the range of about 10 nm to about 25 nm, or in the range of about 20 nm to about 25 nm. The middle channel layer 130 can be a single crystal semiconductor material.

In one or more embodiments, an upper trim layer 140 of a multilayer fin stack can be formed on the middle channel layer 130, where the upper trim layer 140 can be formed by epitaxial growth on the middle channel layer 130. The upper trim layer 140 can be a single crystal semiconductor material. In various embodiments, the upper trim layer 140 can be SiGe, where the upper trim layer 140 can be single crystal SiGe.

In various embodiments, the upper trim layer 140 can have a thickness in the range of about 4 nm to about 10 nm, or in the range of about 5 nm to about 8 nm.

The lower trim layer 120, middle channel layer 130, and upper trim layer 140 can form the multilayer fin stack on the doped layer 115. The lower trim layer 120, middle channel layer 130, upper trim layer 140, and doped layer 115 can form the multilayer semiconductor stack on the substrate 110. In various embodiments, the lower trim layer 120 and upper trim layer 140 can be a different material from the middle channel layer 130, where the lower trim layer 120 and upper trim layer 140 can be selectively etched in relation to the middle channel layer 130.

Figure 2:
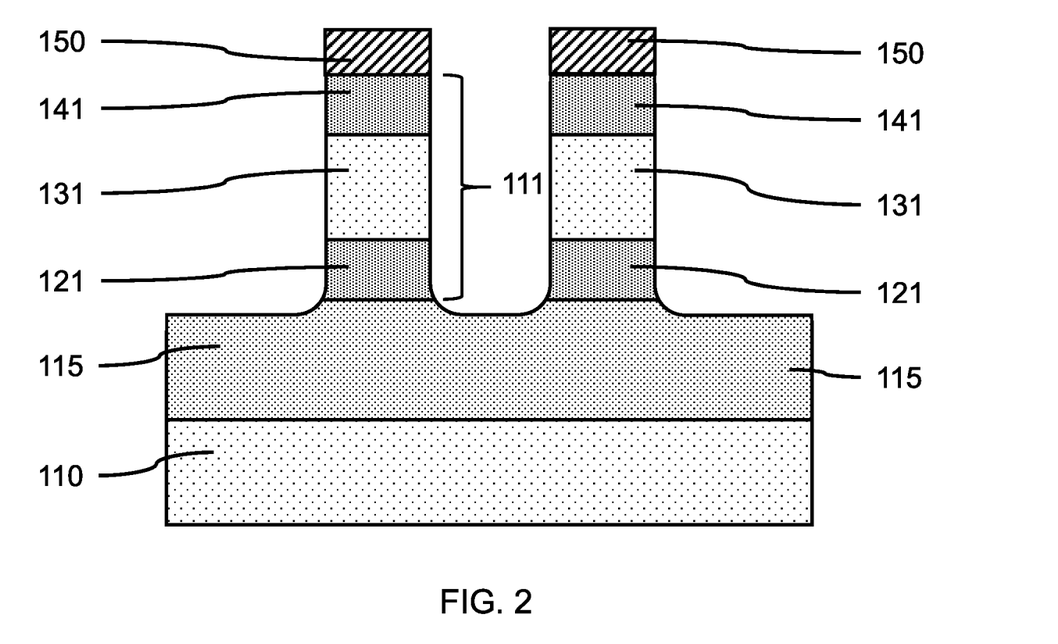
FIG. 2 is a cross-sectional side view showing a plurality of multilayer fins with fin templates, in accordance with an embodiment of the present invention.

FIG. 2 is a cross-sectional side view showing a plurality of multilayer fins with fin templates, in accordance with an embodiment of the present invention.

In one or more embodiments, a plurality of multilayer fins 111 can be formed on doped layer 115 on the substrate 110, where the multilayer fins 111 can be formed by a multiple patterning fabrication process, for example, a sidewall image transfer (SIT) process, a self-aligned double patterning (SADP) process, self-aligned triple patterning (SATP) process, or a self-aligned quadruple patterning (SAQP). The vertical fins may be formed by a direct write process or double patterning process using, for example, immersion lithography, extreme ultraviolet lithography, or x-ray lithography.

In various embodiments, a fin template 150 may be on each of the multilayer fins 111, where the fin template 150 is formed during the patterning process. The fin templates 150 can be a hardmask, for example, silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof.

Formation of the multilayer fins 111 can form an upper trim layer portion 141 from the upper trim layer 140, a fin channel portion 131 from the middle channel layer 130, and a lower trim layer portion 121 from the lower trim layer 120.

The multilayer fins 111 and fin templates 150 can have a width in the range of about 10 nm to about 40 nm, or in the range of about 20 nm to about 30 nm, although other fin widths are contemplated. The multilayer fins 111 can have a height measured from the interface with the underlying doped layer 115 in the range of about 18 nm to about 60 nm, or in the range of about 25 nm to about 46 nm, or about 30 nm to about 40 nm, although other heights are contemplated.

Figure 3:
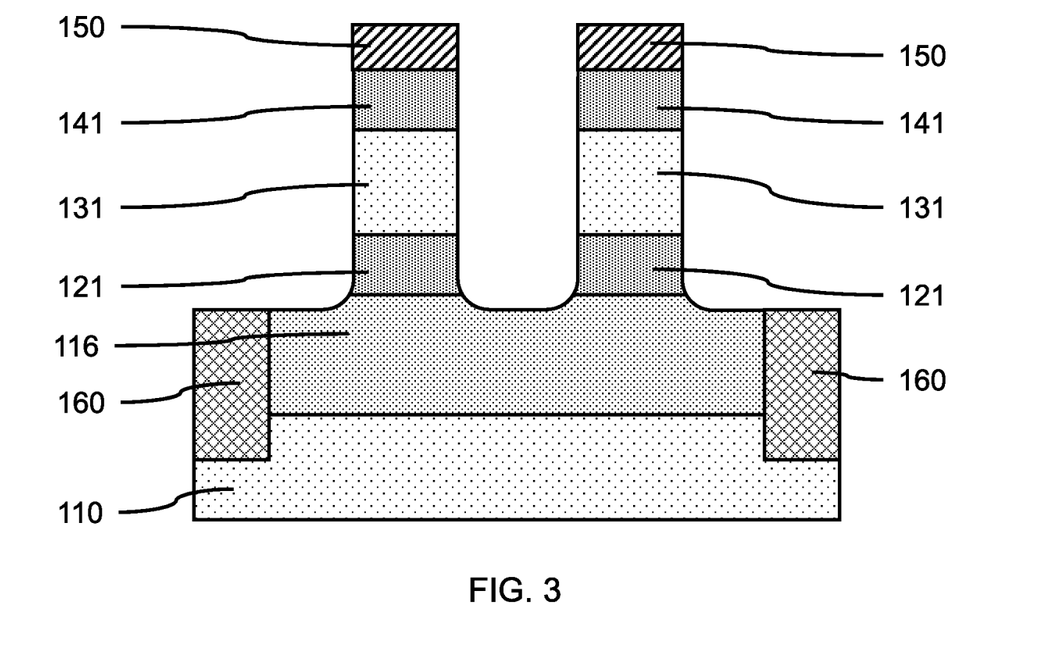
FIG. 3 is a cross-sectional side view showing a plurality of multilayer fins on a substrate with isolation regions, in accordance with an embodiment of the present invention.

FIG. 3 is a cross-sectional side view showing a plurality of multilayer fins on a substrate with isolation regions, in accordance with an embodiment of the present invention.

In one or more embodiments, the plurality of multilayer fins 111 can be masked, and isolation regions 160 can be formed through the doped layer 115 into the substrate 110. The isolation regions 160 can be formed by a directional etch, for example, a reactive ion etch (RIE). The isolation regions 160 can be filled with an insulating dielectric material, for example, silicon oxide (SiO), where the isolation regions 160 can be shallow trench isolation regions. Formation of the isolation regions 160 can separate the doped layer 115 into bottom source/drain regions 116, where one or more multilayer fins 111 can be on the bottom source/drain region 116, which can form a bottom source/drain for a device including the one or more multilayer fins 111.

Figure 4:
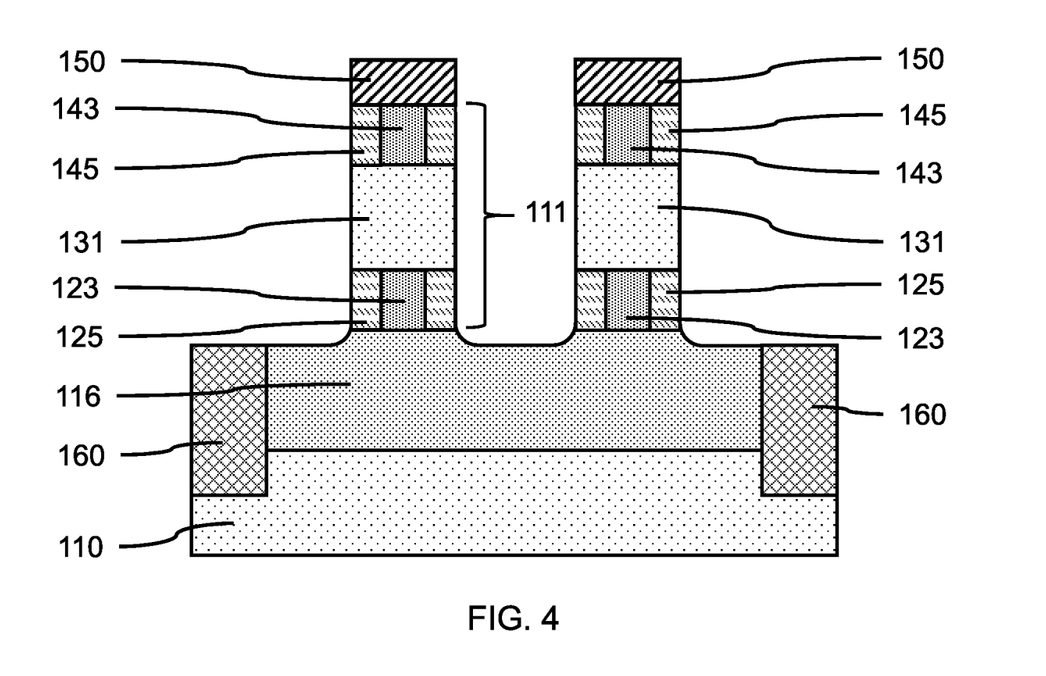
FIG. 4 is a cross-sectional side view showing a plurality of multilayer fins having upper and lower recess fillers formed in upper and lower trim layer recesses, in accordance with an embodiment of the present invention.

FIG. 4 is a cross-sectional side view showing a plurality of multilayer fins having upper and lower recess fillers formed in upper and lower trim layer recesses, in accordance with an embodiment of the present invention.

In one or more embodiments, the lower trim layer portion 121 and upper trim layer portion 141 can be selectively etched in relation to the fin channel portion 131 to form upper and lower trim layer recesses. An upper trim layer post 143 can remain on the fin channel portion 131 and lower trim layer post 123 can remain between the doped layer 115 and fin channel portion. A wet isotropic etch, for example, an SC1 wet etch using ammonium hydroxide, peroxide, and water, can be used to selective remove silicon-germanium (SiGe) material of an SiGe lower trim layer portion 121 and an SiGe upper trim layer portion 141 to form upper and lower trim layer recesses without trimming a silicon (Si) fin channel portion 131. The formed upper and lower trim layer recesses can be annular recesses around the upper and lower trim posts 123, 143.

An upper trim layer post 143 can remain on the fin channel portion 131 after forming the upper trim layer recess. The fin template 150 can be supported by the upper trim layer post 143. An lower trim layer post 123 can remain on the doped layer 115 after forming the lower trim layer recess. The fin channel portion 131 can be supported by the lower trim layer post 123.

In one or more embodiments, an upper recess filler 145 can be formed in the upper trim layer recess, and a lower recess filler 125 can be formed in the lower trim layer recess.

The upper recess filler 145 and lower recess filler 125 can be formed by an isotropic deposition (e.g., atomic layer deposition (ALD), plasma enhanced ALD (PEALD), chemical vapor deposition (CVD), plasma enhanced CVD (PECVD) or a combination thereof), that fills in the upper and lower trim layer recesses. An isotropic etch can be used to remove recess filler material that deposits on the exposed surfaces of the doped layer 115, fin channel portion 131 and fin template 150.

In one or more embodiments, the upper recess filler 145 and a lower recess filler 125 can be silicon nitride (SiN), silicon oxynitride (SiON), silicon carbonitride (SiCN), silicon boronitride (SiBN), silicon borocarbide (SiBC), silicon boro carbonitride (SiBCN), boron nitride (BN), or combinations thereof. In various embodiments, the upper recess filler 145 and a lower recess filler 125 can be silicon boro carbonitride (SiBCN). In various embodiments, the fin templates 150 can be selectively removed relative to the upper recess filler 145 and lower recess filler 125, where, for example, the fin templates 150 can be silicon nitride (SiN) and the upper recess filler 145 and lower recess filler 125 can be SiBCN.

Figure 5:
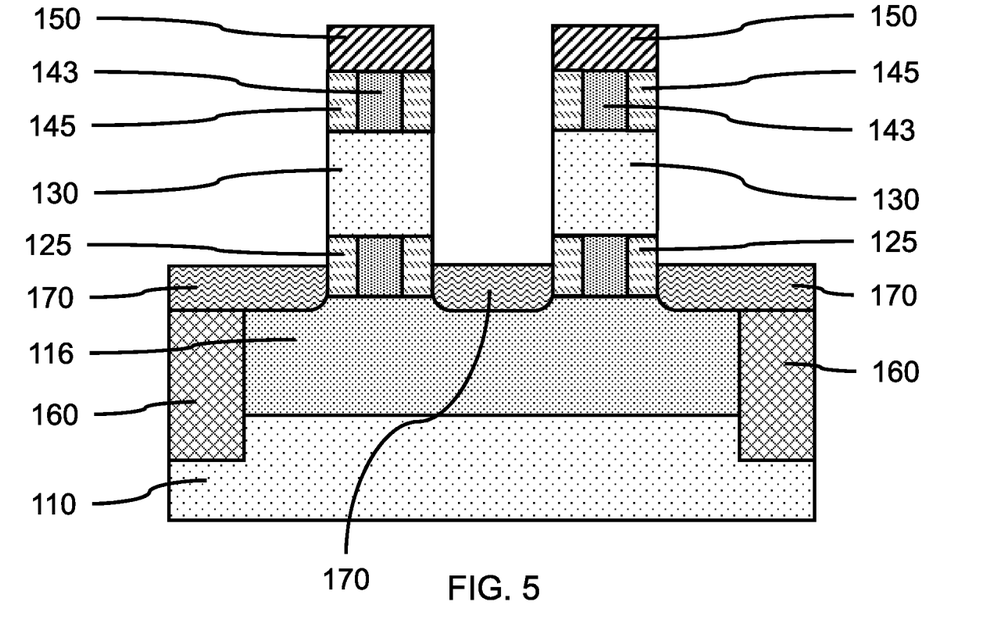
FIG. 5 is a cross-sectional side view showing a bottom spacer layer formed on a bottom source/drain region and lower recess filler, in accordance with an embodiment of the present invention.

FIG. 5 is a cross-sectional side view showing a bottom spacer layer formed on a bottom source/drain region and lower recess filler, in accordance with an embodiment of the present invention.

In one or more embodiments, a bottom spacer layer 170 can be formed on the bottom source/drain region 116, where the bottom spacer layer 170 can be formed by a directional deposition, for example, a gas cluster ion beam (GCIB) deposition or a high density plasma (HDP) deposition. An isotropic etch (e.g., wet chemical etch) can be used to remove deposited material from exposed sidewalls of the multilayer fins 111.

In various embodiments, the bottom spacer layer 170 can have a thickness in the range of about 8 nm to about 15 nm, where the bottom spacer layer 170 can cover the surfaces of the bottom source/drain region 116. The bottom spacer layer 170 can cover at least a portion of the lower recess filler 125 on each of the one or more multilayer fins. The difference in height between the top surface of the lower recess filler 125 and the top surface of the bottom spacer layer 170 can be in the range of about 2 nm to about 4 nm.

In one or more embodiments, the bottom spacer layer 170 can be silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), boron carbide (BC), boron nitride (BN), or combinations thereof, where the bottom spacer layer 170 can be a material different from the upper recess filler 145 and lower recess filler 125.

Figure 6:
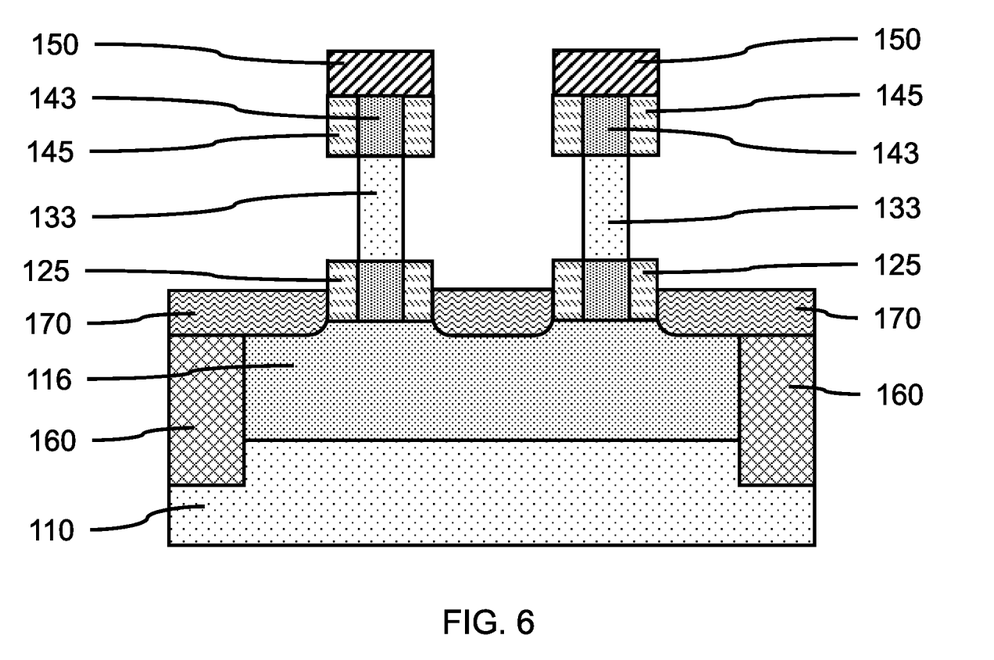
FIG. 6 is a cross-sectional side view showing fin channel posts after laterally trimming the fin channel portions of the multilayer fin stack, in accordance with an embodiment of the present invention.

FIG. 6 is a cross-sectional side view showing fin channel posts after laterally trimming the fin channel portions of the multilayer fin stack, in accordance with an embodiment of the present invention.

In one or more embodiments, the fin channel portion 131 can be thinned, where a portion of the fin channel portion 131 can be removed to form a fin channel post 133. The fin channel post 133 can form the middle layer of the multilayer fin 111 between the upper trim layer post 143 and lower trim layer post 123.

In various embodiments, the fin channel post 133 can have a width in the range of about 4 nm to about 12 nm, or in the range of about 5 nm to about 10 nm, or in the range of about 6 nm to about 8 nm. The upper trim layer post 143 and lower trim layer post 123 can have widths in the range of about 4 nm to about 12 nm, or in the range of about 5 nm to about 10 nm, or in the range of about 6 nm to about 8 nm, where the widths of the upper trim layer post 143 and lower trim layer post 123 are similar to the width of the fin channel post 133 (i.e., less than 1 nm variation in widths). The outer sidewalls of the upper recess filler 145 and lower recess filler 125 can extend away from the sidewalls of the fin channel post 133. The upper recess filler 145 can be on the sidewalls of the upper trim layer post 143, where the upper recess filler can form an overhang that shadows the sidewalls of the fin channel post 133.

Figure 7:
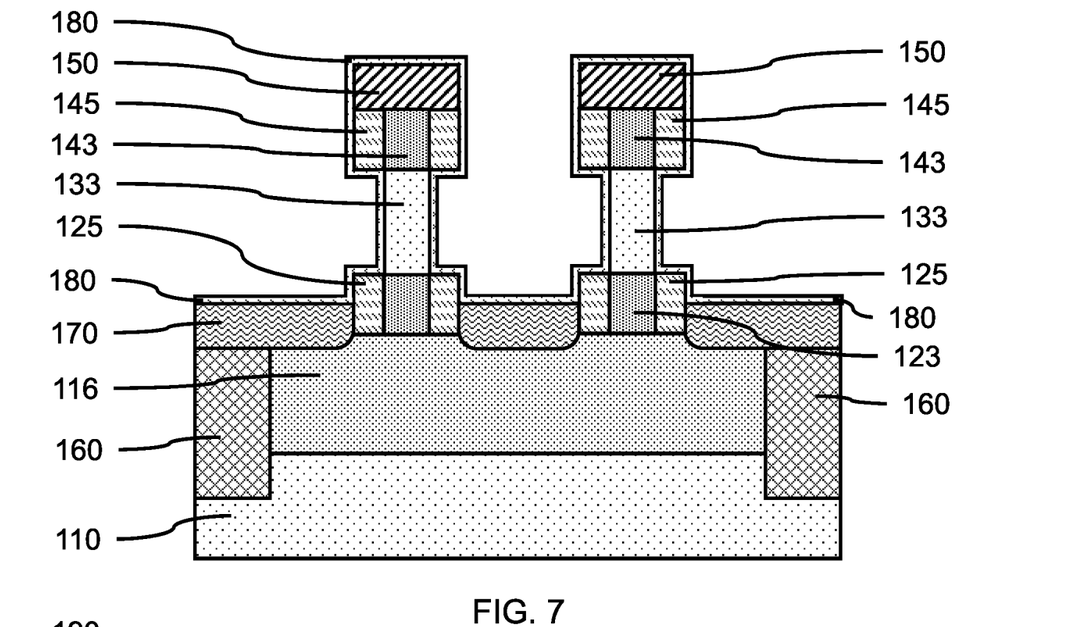
FIG. 7 is a cross-sectional side view showing a high-k dielectric layer formed on the exposed surfaces of the bottom spacer layer, lower recess fillers, fin channel posts, upper recess fillers, and fin templates, in accordance with an embodiment of the present invention.

FIG. 7 is a cross-sectional side view showing a high-k dielectric layer formed on the exposed surfaces of the bottom spacer layer, lower recess fillers, fin channel posts, upper recess fillers, and fin templates, in accordance with an embodiment of the present invention.

In one or more embodiments, a high-k dielectric layer 180 can be formed on the exposed surfaces of the bottom spacer layer 170, lower recess filler 125, fin channel post 133, upper recess filler 145, and fin template 150 of each multilayer fin 111. The high-k dielectric layer 180 can be formed by a conformal deposition (i.e., ALD, PEALD, or a combination thereof).

In various embodiments, the high-k dielectric layer 180 can be metal oxides, for example, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), and aluminum oxide (AlO). The high-k material can further include dopants such as lanthanum (La) and aluminum (Al). In various embodiments, the high-k dielectric layer 180 can be stoichiometric hafnium oxide (e.g., $HfO_2$).

In various embodiments, the high-k dielectric layer 180 can have a thickness in the range of about 1 nm to about 4 nm, or in the range of about 1.5 nm to about 2.5 nm.

Figure 8:
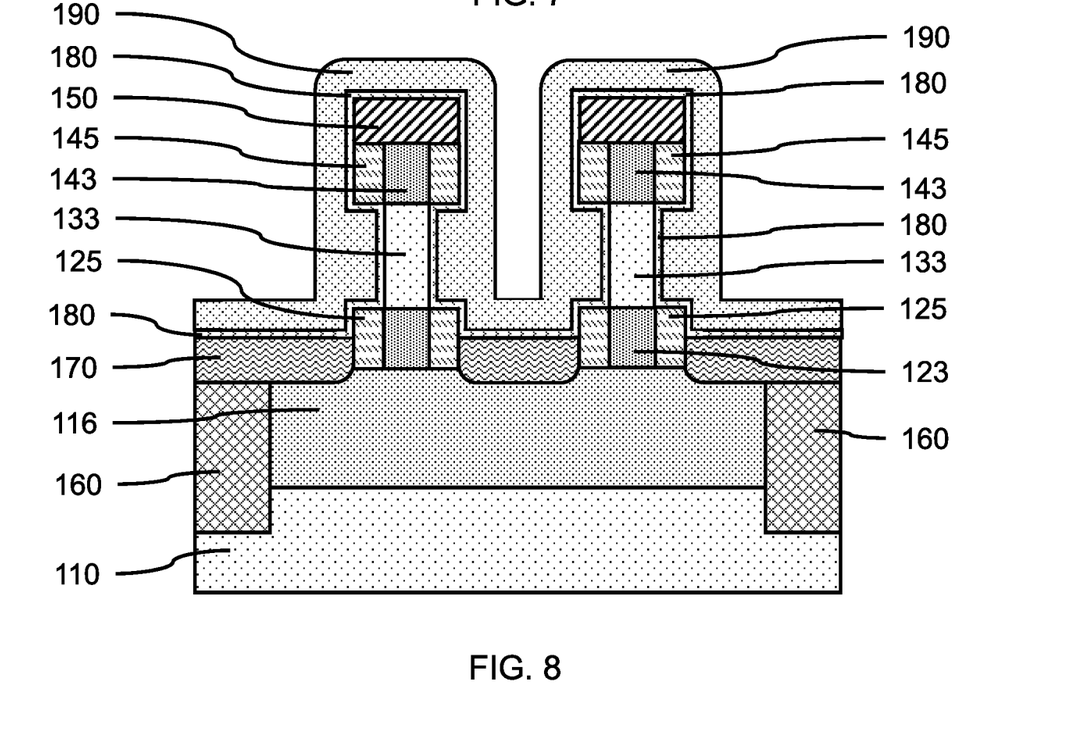
FIG. 8 is a cross-sectional side view showing a protective jacket layer on the high-k dielectric layer, in accordance with an embodiment of the present invention.

FIG. 8 is a cross-sectional side view showing a protective jacket layer on the high-k dielectric layer, in accordance with an embodiment of the present invention.

In one or more embodiments, a protective jacket layer 190 can be formed on the high-k dielectric layer 180, where the protective jacket layer 190 can be formed by an isotropic deposition (e.g., ALD, PEALD, CVD, PECVD). In various embodiments, the protective jacket layer 190 can be polycrystalline silicon (poly-Si), amorphous carbon (a-C), or a spin-on glass.

Figure 9:
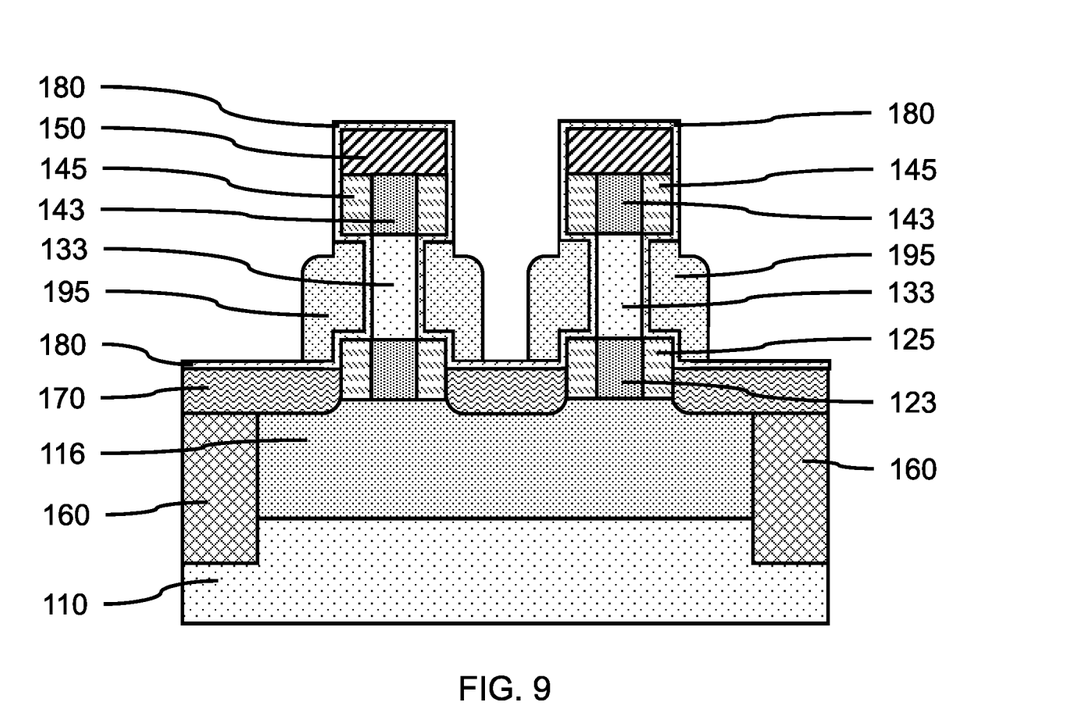
FIG. 9 is a cross-sectional side view showing an exposed portion of the high-k dielectric layer and protective aprons on the thinned fin channel portions and lower recess fillers after etching back the protective jacket layer, in accordance with an embodiment of the present invention.

FIG. 9 is a cross-sectional side view showing an exposed portion of the high-k dielectric layer and protective aprons on the thinned fin channel portions and lower recess fillers after etching back the protective jacket layer, in accordance with an embodiment of the present invention.

In one or more embodiments, a portion of the protective jacket layer 190 can be removed to expose a portion of the high-k dielectric layer 180 on the bottom spacer layer 170, fin templates 150, and upper recess filler 145. The portion of the protective jacket layer 190 can be removed using a directional etch (e.g., RIE) to form protective aprons 195 from vertical portions of the protective jacket layer 190 on the high-k dielectric layer 180 covering the fin channel post 133, bottom spacer layer 170, and lower recess fillers 125, while removing horizontal portions of the protective jacket layer 190.

Figure 10:
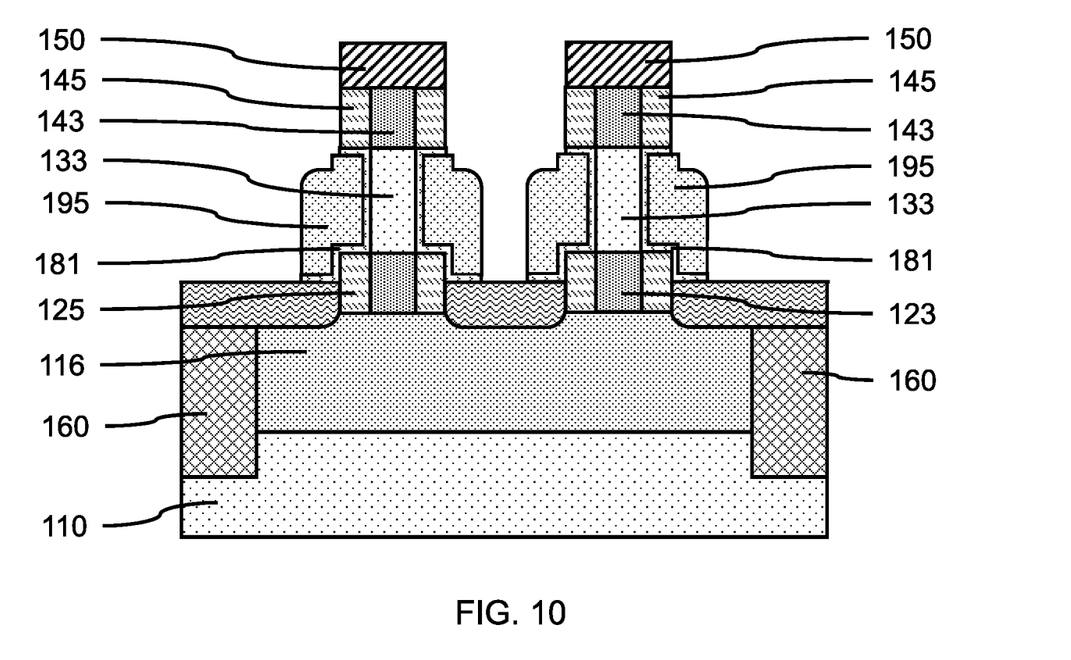
FIG. 10 is a cross-sectional side view showing exposed fin templates and upper recess fillers after removing the exposed portion of the high-k dielectric layer, in accordance with an embodiment of the present invention.

FIG. 10 is a cross-sectional side view showing exposed fin templates and upper recess fillers after removing the exposed portion of the high-k dielectric layer, in accordance with an embodiment of the present invention.

In one or more embodiments, exposed portions of the high-k dielectric layer 180 can be removed to expose portions of bottom spacer layer 170, fin templates 150, and upper recess fillers 145. A high-k channel liner 181 can remain on the sidewalls of the fin channel post 133 and portions of the upper recess fillers 145 and lower recess fillers 125. A portion of the high-k channel liner 181 can remain on the overhanging bottom surface of the upper recess fillers 145 to form an overhanging portion of the high-k dielectric layer. Exposed portions of the high-k dielectric layer 180 can be removed using a controlled isotropic etch (e.g., wet chemical etch, plasma etch), where the high-k dielectric layer 180 can be trimmed flush with the sidewall surface of the upper recess fillers 145, or a distance in the range of about 1 nm to 2 nm inward from the sidewall surface.

Figure 11:
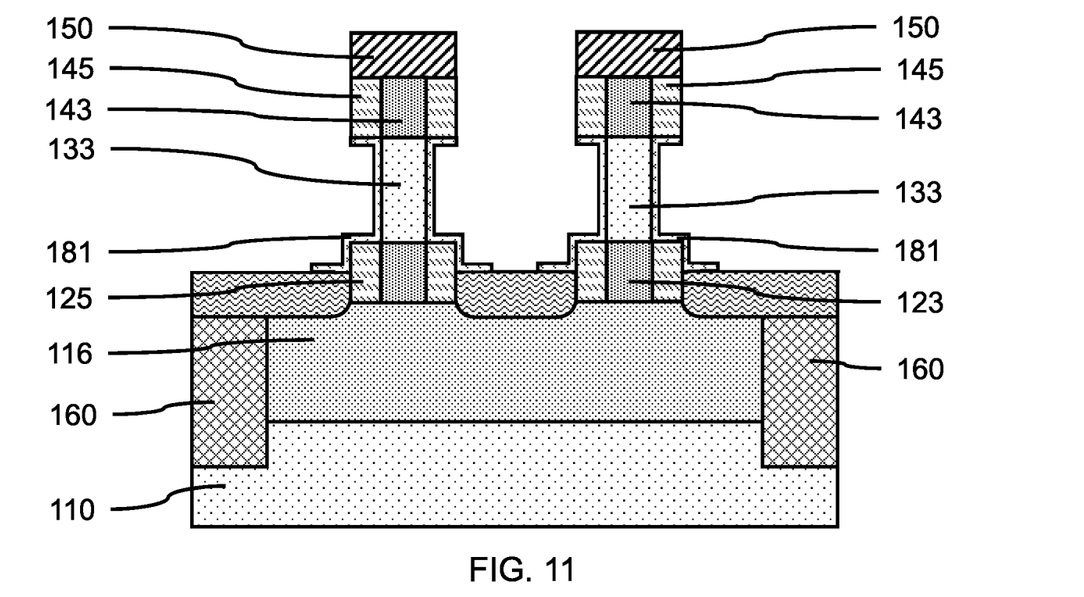
FIG. 11 is a cross-sectional side view showing exposed high-k channel liners on the fin channel posts and lower recess fillers, after removing the protective aprons, in accordance with an embodiment of the present invention.

FIG. 11 is a cross-sectional side view showing exposed high-k channel liners on the fin channel posts and lower recess fillers, after removing the protective aprons, in accordance with an embodiment of the present invention.

In one or more embodiments, the protective aprons 195 can be removed using a selective isotropic etch (e.g., wet etch) to expose the high-k channel liners 181.

Figure 12:
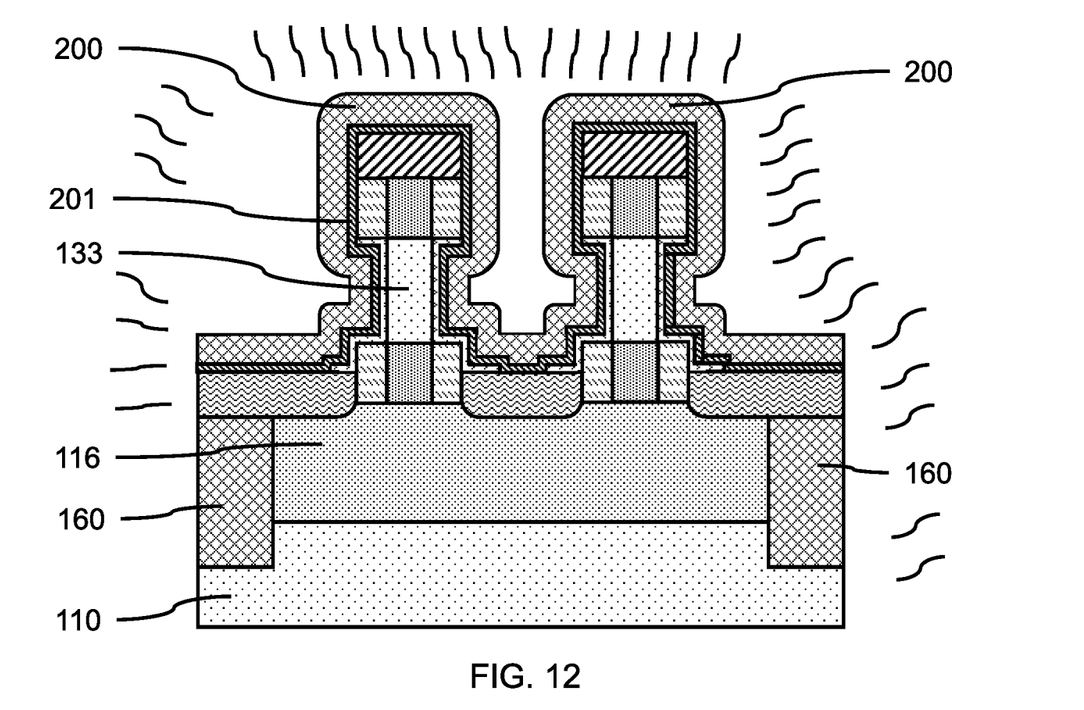
FIG. 12 is a cross-sectional side view showing a heat treatment after forming a cover layer on the bottom spacer layer, high-k channel liners, upper recess fillers, and fin templates, in accordance with an embodiment of the present invention.

FIG. 12 is a cross-sectional side view showing a heat treatment after forming a cover layer on the bottom spacer layer, high-k channel liners, upper recess fillers, and fin templates, in accordance with an embodiment of the present invention.

In one or more embodiments, a cover layer 200 can be formed on the bottom spacer layer 170, high-k channel liners 181, upper recess fillers 145, and fin templates 150. The cover layer 200 can be amorphous silicon (a-Si). A annealing liner 201 can be formed on the bottom spacer layer 170, high-k channel liners 181, upper recess fillers 145, and fin templates 150 before forming the cover layer 200. The annealing liner 201 can be titanium nitride (TiN).

Figure 13:
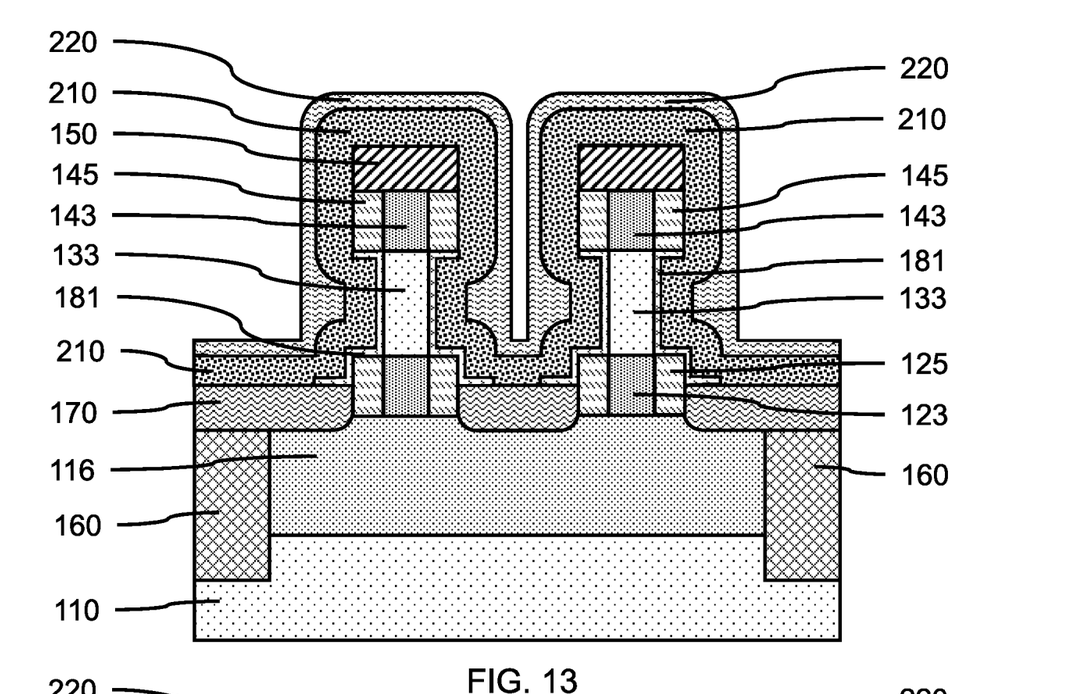
FIG. 13 is a cross-sectional side view showing a work function layer formed on the bottom spacer layer, high-k channel liners, upper recess fillers, and fin templates, and a boarder liner on the work function layer, in accordance with an embodiment of the present invention.

FIG. 13 is a cross-sectional side view showing a work function layer formed on the bottom spacer layer, high-k channel liners, upper recess fillers, and fin templates, and a boarder liner formed on the work function layer, in accordance with an embodiment of the present invention.

In one or more embodiments, the cover layer 200 and annealing liner 201 can be removed after heat treating the other device features.

In one or more embodiments, a work function layer 210 can be formed on the bottom spacer layer, high-k channel liners, upper recess fillers, and fin templates, where the work function layer 210 can be formed by a conformal deposition (i.e., ALD, PEALD).

In various embodiments, the work function layer 210 can be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. The work function layer 210 can form a gate electrode for the VT FinFET. A metal gate material may not be formed on the work function layer 210 as part of the gate electrode.

In one or more embodiments, a boarder liner 220 can be formed on the work function layer 210, where the boarder liner 220 can be formed by an isotropic deposition (e.g., ALD, PEALD, CVD, PECVD, or a combination thereof).

In one or more embodiments, the boarder liner 220 can be silicon nitride (SiN), silicon oxynitride (SiON), silicon carbonitride (SiCN), silicon boronitride (SiBN), silicon borocarbide (SiBC), silicon boro carbonitride (SiBCN), boron nitride (BN), or combinations thereof. In various embodiments, the boarder liner 220 can be silicon boro carbonitride (SiBCN). The boarder liner 220 can be a dielectric material different from fin templates 150 and work function layer 210 to allow selective removal.

Figure 14:
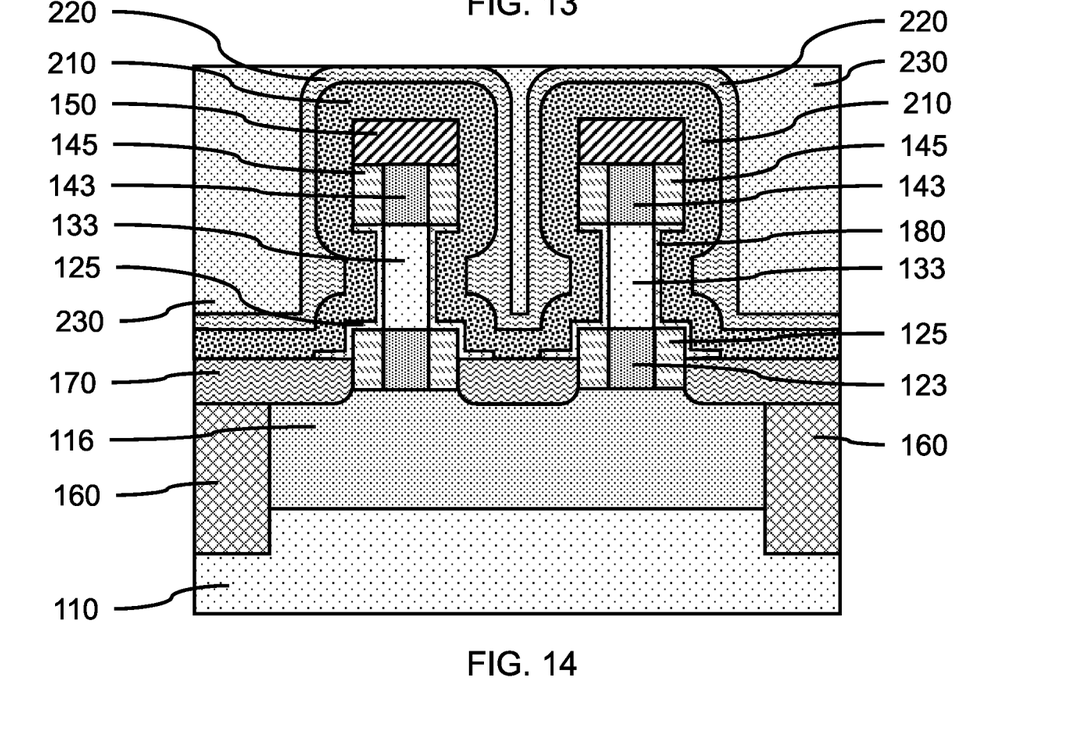
FIG. 14 is a cross-sectional side view showing a fill layer on the boarder liner, in accordance with an embodiment of the present invention.

FIG. 14 is a cross-sectional side view showing a fill layer on the boarder liner, in accordance with an embodiment of the present invention.

In one or more embodiments, a fill layer 230 can be formed on the boarder liner 220. The fill layer 230 can be a dielectric material selected from the group consisting of silicon oxide (SiO), a low-K insulating dielectric, silicon oxynitride (SiON), carbon doped silicon oxide (SiO:C), fluorine doped silicon oxide (SiO:F), boron carbon nitride (BCN), hydrogen silsesquioxane polymer (HSQ), methyl silsesquioxane polymer (MSQ), organosilicate glass (SiCOH), porous SiCOH, and combinations thereof.

Figure 15:
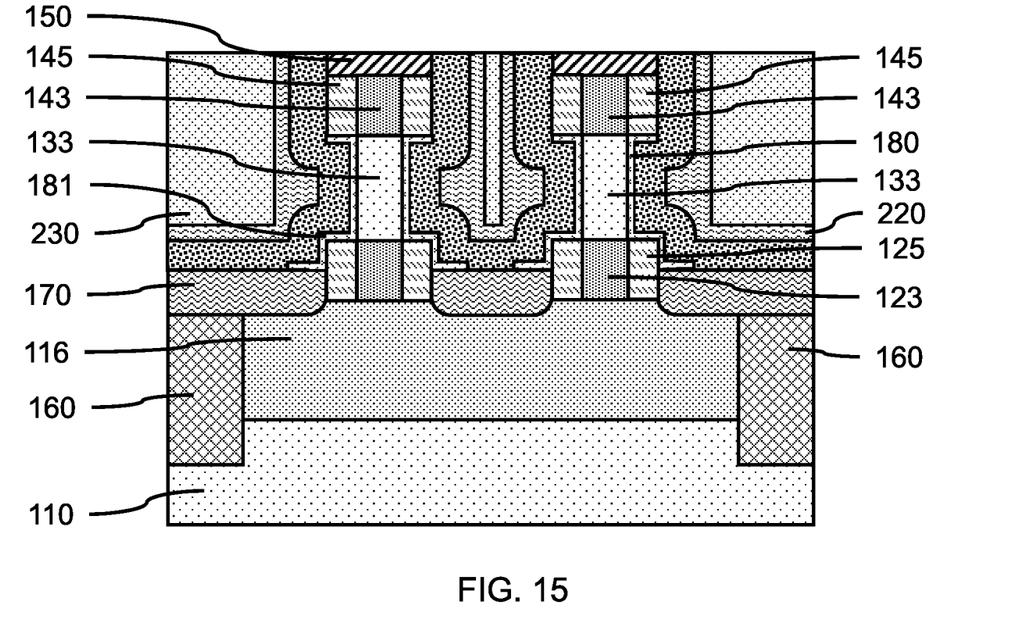
FIG. 15 is a cross-sectional side view showing the fill layer, boarder liner, work function layer, and fin templates with a reduced height, in accordance with an embodiment of the present invention.

FIG. 15 is a cross-sectional side view showing the fill layer, boarder liner, work function layer, and fin templates with a reduced height, in accordance with an embodiment of the present invention.

In one or more embodiments, a chemical-mechanical polishing (CMP) can be used to remove an upper portion of the fill layer 230, boarder liner 220, and work function layer 210 to expose a top surface of the fin templates 150.

Figure 16:
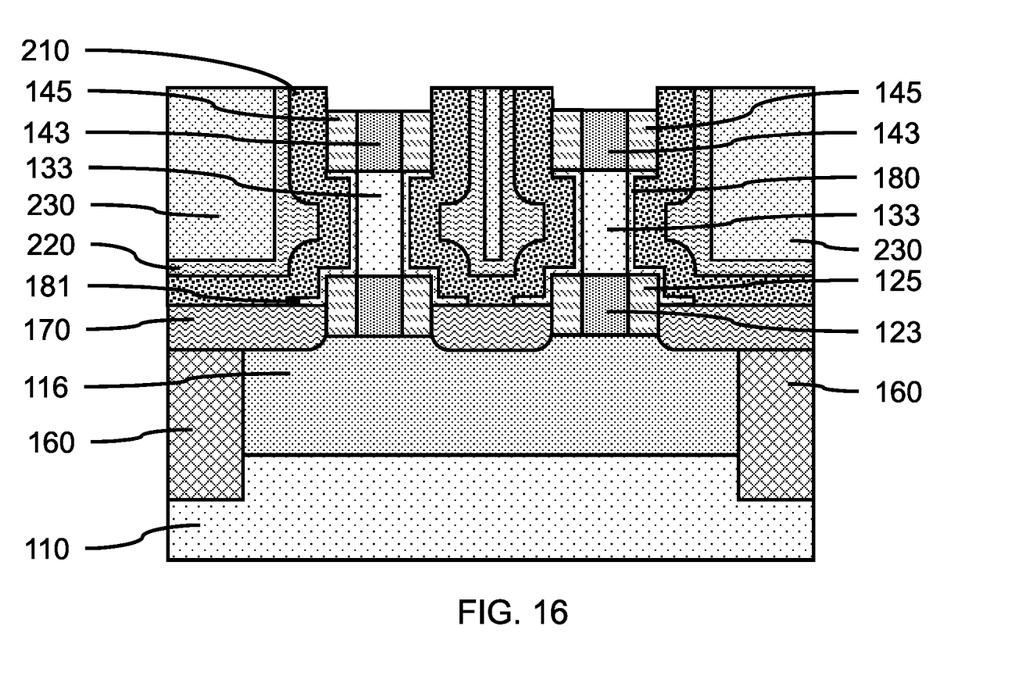
FIG. 16 is a cross-sectional side view showing the top surfaces of the upper recess fillers and upper trim layer post exposed by removing the fin templates, in accordance with an embodiment of the present invention.

FIG. 16 is a cross-sectional side view showing the top surfaces of the upper recess fillers and upper trim layer post exposed by removing the fin templates, in accordance with an embodiment of the present invention.

In one or more embodiments, the fin templates 150 can be removed by a selective etch (e.g., wet chemical etch, plasma etch) to expose the top surfaces of the upper recess fillers 145 and upper trim layer post 143.

Figure 17:
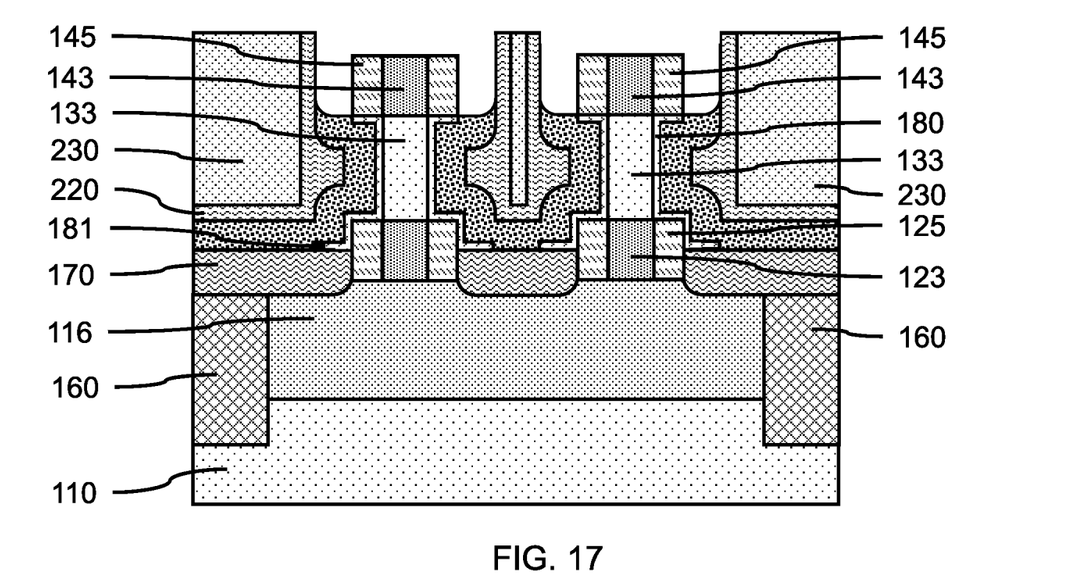
FIG. 17 is a cross-sectional side view showing the upper recess fillers and upper trim layer portion exposed by removing a portion of the work function layer, in accordance with an embodiment of the present invention.

FIG. 17 is a cross-sectional side view showing the upper recess fillers and upper trim layer post exposed by removing a portion of the work function layer, in accordance with an embodiment of the present invention.

In one or more embodiments, at least a portion of the sidewalls of the upper recess fillers 145 can be exposed by removing a portion of the work function layer 210 using a selective etch. The top surface of the work function layer can remain above the portion of the high-k channel liner 181 on the overhanging surface of the upper recess fillers 145. Removal of the portion of the work function layer can form a trough.

Figure 18:
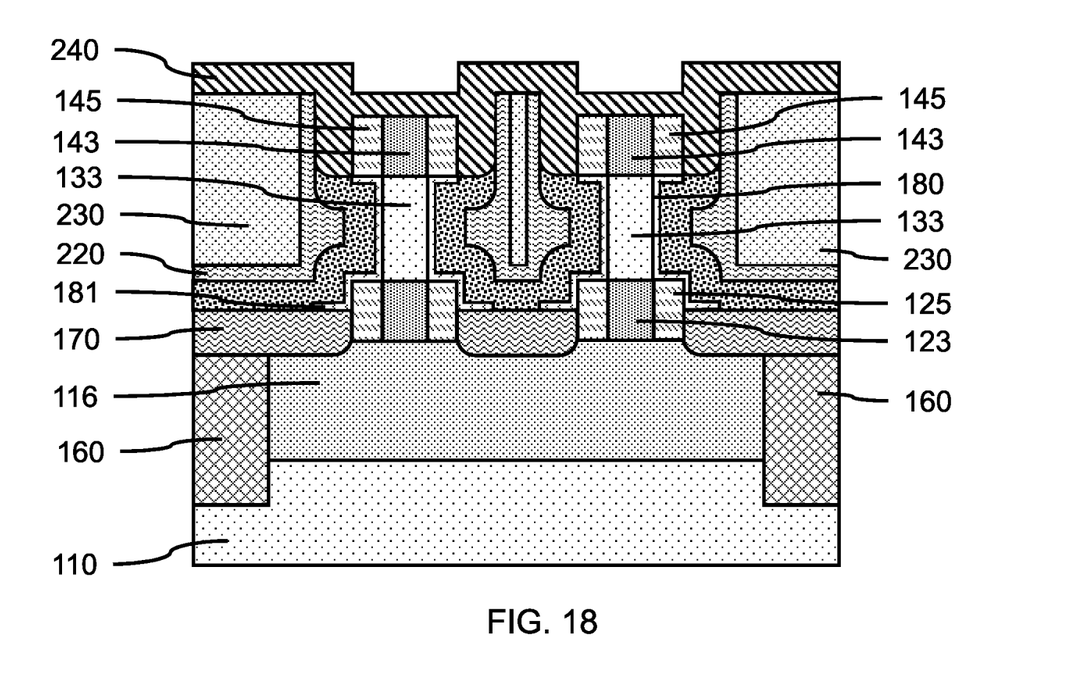
FIG. 18 is a cross-sectional side view showing a hardmask layer on the fill layer, upper recess fillers, and upper trim layer post, in accordance with an embodiment of the present invention.

FIG. 18 is a cross-sectional side view showing a hardmask layer on the fill layer, upper recess fillers, and upper trim layer post, in accordance with an embodiment of the present invention.

In one or more embodiments, a hardmask layer 240 can be formed on the fill layer 230, upper recess fillers 145, and upper trim layer post 143. The hardmask layer 240 can be silicon nitride (SiN). The hardmask layer 240 can fill in the troughs adjacent to the upper recess fillers 145 and boarder liner 220 formed by removing the portion of the work function layer 210.

Figure 19:
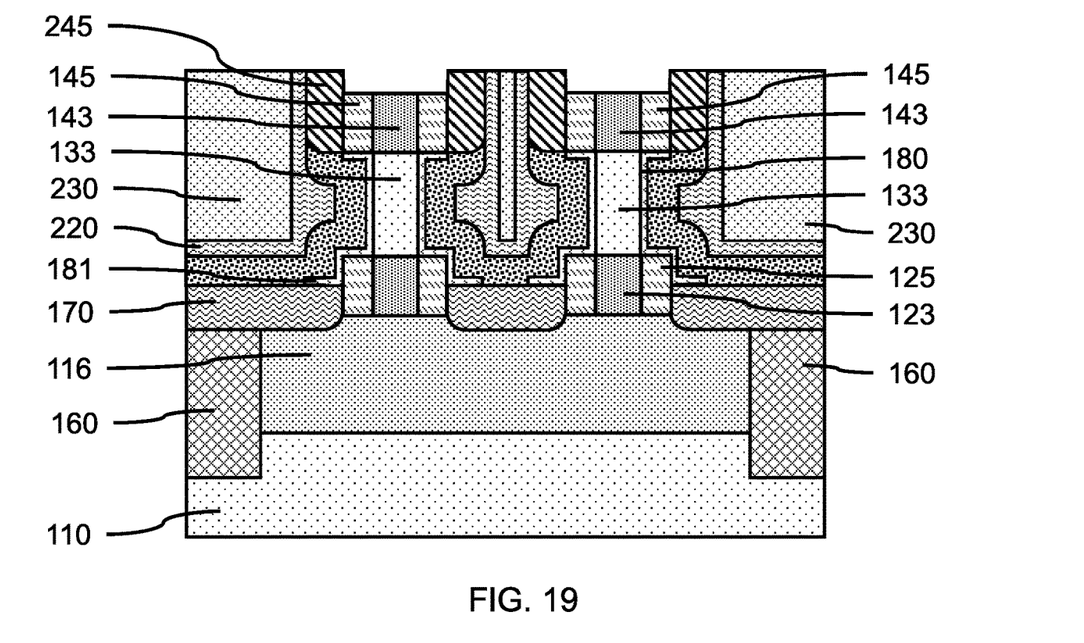
FIG. 19 is a cross-sectional side view showing an exposed fill layer, upper recess fillers, and upper trim layer post after etching back a portion of the hardmask layer to form hardmask collars, in accordance with an embodiment of the present invention.

FIG. 19 is a cross-sectional side view showing an exposed fill layer, upper recess fillers, and upper trim layer post after etching back a portion of the hardmask layer to form hardmask collars, in accordance with an embodiment of the present invention.

In one or more embodiments, a portion of the hardmask layer 240 can be removed from the horizontal surfaces, where the hardmask layer 240 can be removed using a directional etch (e.g., RIE) to expose the fill layer 230, upper recess fillers 145, and upper trim layer post 143. A portion of the hardmask layer 240 can remain in the troughs adjacent to the upper recess fillers 145 and boarder liner 220 to form hardmask collars 245 between the upper recess fillers 145 and boarder liner 220.

Figure 20:
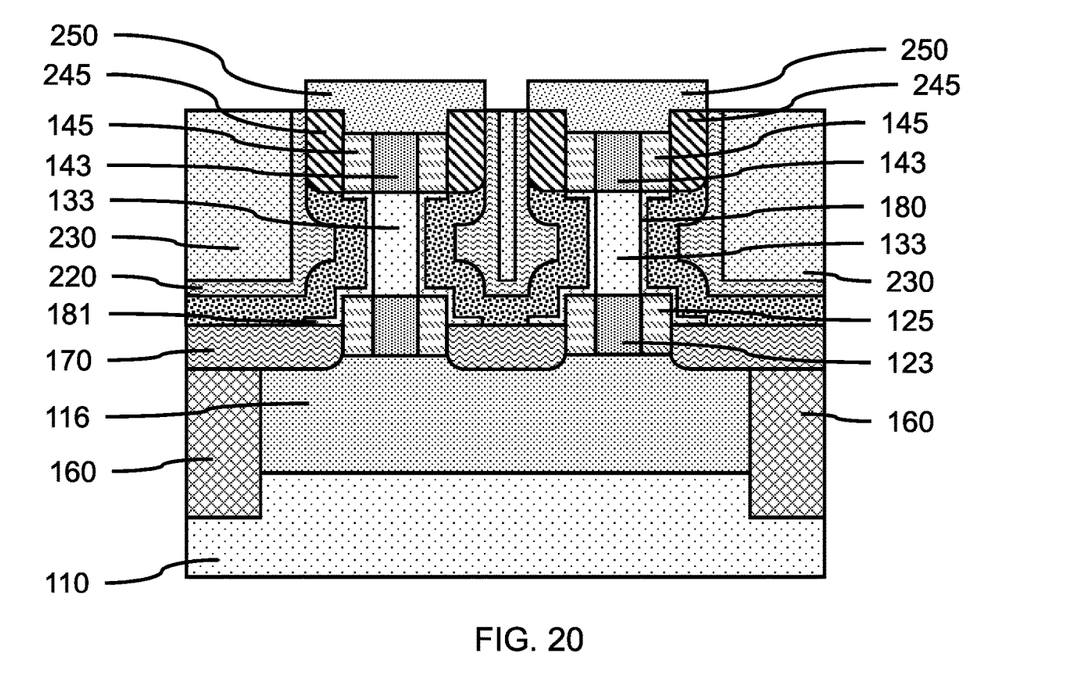
FIG. 20 is a cross-sectional side view showing a top source/drain region formed on the hardmask collars, upper recess fillers, and upper trim layer posts, in accordance with an embodiment of the present invention.

FIG. 20 is a cross-sectional side view showing a top source/drain region formed on the hardmask collars, upper recess fillers, and upper trim layer posts, in accordance with an embodiment of the present invention.

In one or more embodiments, a top source/drain region 250 can be formed on the top surfaces of the hardmask collars 245, upper recess fillers 145, and upper trim layer posts 143, where the top source/drain region 250 can be formed by an epitaxial growth process.

In various embodiments, the top source/drain region 250 can be suitably doped with n-type dopants and/or p-type dopants to form a source/drain for the VT fin field effect transistor device. The top source/drain region 250 can be a semiconductor material, for example, silicon (Si) or silicon-germanium (SiGe), where the top source/drain region 250 can be a single crystal material.

A VT FinFet can be configured to conduct a current between the top source/drain region 250 and bottom source/drain regions 116 through the upper trim layer post 143, fin channel post 133, and lower trim layer post 123, where the gate structure including the high-k channel liner 181 and work function layer 210 can control the current flow. The trimmed high-k channel liner 181 on the overhang can avoid having a gate dielectric layer extending beyond a gate electrode.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A vertical transport fin field effect transistor (VT FinFET), comprising:
   a bottom source/drain region on a substrate;
   a lower trim layer post on the bottom source/drain region;
   a fin channel post on the lower trim layer post;
   an upper trim layer post on the fin channel post;
   an upper recess filler on the sidewalls of the upper trim layer post;
   a high-k channel liner on the fin channel post and a bottom surface of the upper recess filler; and
   a bottom spacer layer on the bottom source/drain region that is laterally offset from the lower trim layer post.

2. The VT FinFET of claim 1, further comprising a hardmask collar around the upper recess filler and upper trim layer post.

3. The VT FinFET of claim 1, further comprising, a work function layer on the high-k channel liner.

4. The VT FinFET of claim 3, wherein the material of the high-k channel liner is selected from the group consisting of hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), and aluminum oxide (AlO).

5. The VT FinFET of claim 3, wherein the lower trim layer post and upper trim layer post are silicon-germanium, and the fin channel post is silicon.

6. The VT FinFET of claim 3, further comprising a boarder liner on at least a portion of the work function layer.

7. The VT FinFET of claim 6, further comprising a fill layer on the boarder liner.

8. The VT FinFET of claim 6, wherein the boarder liner is made of a material selected from the group consisting of silicon nitride (SiN), silicon oxynitride (SiON), silicon carbonitride (SiCN), silicon boronitride (SiBN), silicon borocarbide (SiBC), silicon boro carbonitride (SiBCN), boron nitride (BN), and combinations thereof.

9. The VT FinFET of claim 6, wherein the boarder liner is in physical contact with a portion of the hardmask collar and a portion of the work function layer.

10. A vertical transport fin field effect transistor (VT FinFET), comprising:
    a bottom source/drain region on a substrate;
    a lower trim layer post on the bottom source/drain region;
    a lower recess filler on the sidewalls of the lower trim layer post;
    a fin channel post on the lower trim layer post;
    an upper trim layer post on the fin channel post;
    an upper recess filler on the sidewalls of the upper trim layer post;
    a high-k channel liner on the lower recess filler, fin channel post, and a bottom surface of the upper recess filler; and
    a bottom spacer layer on the bottom source/drain region that is laterally adjacent to the lower recess filler.

11. The VT FinFET of claim 10, further comprising a bottom spacer layer on the bottom source/drain region and on a portion of the lower recess filler.

12. The VT FinFET of claim 11, wherein the bottom spacer layer has a thickness in a range of about 8 nm to about 15 nm.

13. The VT FinFET of claim 11, wherein a portion of the high-k channel liner in in physical contact with the bottom spacer layer.

14. The VT FinFET of claim 11, wherein the lower trim layer post is silicon-germanium (SiGe), the upper trim layer post is silicon-germanium (SiGe), and the fin channel post is silicon (Si).

15. The VT FinFET of claim 14, further comprising top source/drain region on the top surfaces of the upper recess filler and upper trim layer post.

16. A vertical transport fin field effect transistor (VT FinFET), comprising:
    a bottom source/drain region on a substrate;
    a lower trim layer post on the bottom source/drain region, wherein the lower trim layer post is silicon-germanium (SiGe);
    a lower recess filler on the sidewalls of the lower trim layer post;
    a fin channel post on the lower trim layer post;
    an upper trim layer post on the fin channel post, wherein the upper trim layer post is silicon-germanium (SiGe);
    an upper recess filler on the sidewalls of the upper trim layer post; and
    a high-k channel liner on the lower recess filler, fin channel post, and a bottom surface of the upper recess filler.

17. The VT FinFET of claim 16, wherein the lower trim layer post has a height in a range of about 4 nm to about 10 nm, and the upper trim layer post has a height in a range of about 4 nm to about 10 nm.

18. The VT FinFET of claim 16, wherein the lower recess filler and the ussper recess filler are made of a material selected from the group consisting of silicon nitride (SiN), silicon oxynitride (SiON), silicon carbonitride (SiCN), silicon boronitride (SiBN), silicon borocarbide (SiBC), silicon boro carbonitride (SiBCN), boron nitride (BN), or combinations thereof.

19. The VT FinFET of claim 16, further comprising a bottom spacer layer on the bottom source/drain region and on a portion of the lower recess filler.

20. The VT FinFET of claim 19, further comprising a hardmask collar around the upper recess filler and upper trim layer post.

\* \* \* \* \*